(12) United States Patent
Saklang et al.

(10) Patent No.: US 11,049,817 B2
(45) Date of Patent: Jun. 29, 2021

(54) SEMICONDUCTOR DEVICE WITH INTEGRAL EMI SHIELD

(71) Applicant: NXP B.V., Eindhoven (NL)

(72) Inventors: Chayathorn Saklang, Bangplee (TH); Amornthep Saiyajitara, Bangkok (TH); Chanon Suwankasab, Pathumthani (TH); Russell Joseph Lynch, West Bloomfield, MI (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/283,853

(22) Filed: Feb. 25, 2019

(65) Prior Publication Data

US 2020/0273810 A1    Aug. 27, 2020

(51) Int. Cl.
| | |
|---|---|
| *H01L 23/552* | (2006.01) |
| *H01L 23/06* | (2006.01) |
| *H01L 23/29* | (2006.01) |
| *H01L 23/31* | (2006.01) |
| *H01L 23/495* | (2006.01) |
| *H01L 23/49* | (2006.01) |
| *H01L 23/528* | (2006.01) |

(52) U.S. Cl.
CPC ............ *H01L 23/552* (2013.01); *H01L 23/06* (2013.01); *H01L 23/29* (2013.01); *H01L 23/3107* (2013.01); *H01L 23/49* (2013.01); *H01L 23/4952* (2013.01); *H01L 23/49503* (2013.01); *H01L 23/49575* (2013.01); *H01L 23/528* (2013.01)

(58) Field of Classification Search
CPC . H01L 23/552; H01L 23/49503; H01L 23/29; H01L 23/49575; H01L 23/528; H01L 23/4952; H01L 23/06; H01L 23/49; H01L 23/3107
See application file for complete search history.

(56) References Cited

U.S. PATENT DOCUMENTS

| | | | |
|---|---|---|---|
| 5,166,772 A | 11/1992 | Soldner et al. | |
| 5,270,488 A * | 12/1993 | Ono | H01L 23/552 174/350 |
| 5,350,943 A * | 9/1994 | Angerstein | H01L 23/49551 257/659 |
| 5,557,142 A | 9/1996 | Gilmore et al. | |
| 5,679,975 A * | 10/1997 | Wyland | H01L 23/552 257/659 |
| 5,744,827 A | 4/1998 | Jeong et al. | |
| 6,329,705 B1 * | 12/2001 | Ahmad | H01L 23/16 257/666 |
| 6,740,959 B2 | 5/2004 | Alcoe et al. | |
| 7,781,266 B2 | 8/2010 | Zhao et al. | |

(Continued)

*Primary Examiner* — Sitaramarao S Yechuri

(57) ABSTRACT

A shielded semiconductor device has a first die attached to a die pad of a lead frame and a second die attached to a surface of the first die. The first die is electrically connected to inner lead ends of leads that surround the die pad, and the second die is electrically connected to the first die and to an inner end of a shielding lead. A mold compound forms a body around the first and second dies and the electrical connections. Outer lead ends of the leads project from the sides of the body. The outer end of the shielding lead projects from a central location of one side of the body and is bent up the side surface from which it projects and over the top of the body and provides EMI shielding.

19 Claims, 2 Drawing Sheets

(56) References Cited

U.S. PATENT DOCUMENTS

| | | | |
|---|---|---|---|
| 8,138,584 | B2 | 3/2012 | Wang et al. |
| 8,502,371 | B2 | 8/2013 | Camacho et al. |
| 8,901,722 | B2 * | 12/2014 | Ge .................... H01L 23/49568 |
| | | | 257/666 |
| 9,153,543 | B1 | 10/2015 | Mangrum et al. |
| 9,362,209 | B1 | 6/2016 | Mangrum |
| 9,484,289 | B2 * | 11/2016 | Ge .................... H01L 23/49568 |
| 2004/0232534 | A1 * | 11/2004 | Seki ........................ C25D 5/02 |
| | | | 257/678 |
| 2005/0101161 | A1 * | 5/2005 | Weiblen ................ B81B 7/0064 |
| | | | 439/37 |
| 2007/0071268 | A1 | 3/2007 | Harney et al. |
| 2008/0014678 | A1 | 1/2008 | Howard et al. |
| 2012/0126378 | A1 | 5/2012 | San Antonio et al. |
| 2014/0239476 | A1 * | 8/2014 | Ge .................... H01L 23/3677 |
| | | | 257/690 |
| 2015/0278675 | A1 * | 10/2015 | Finn ................ G06K 19/07783 |
| | | | 235/492 |
| 2016/0141229 | A1 * | 5/2016 | Paek ....................... H01L 24/32 |
| | | | 257/673 |
| 2016/0172309 | A1 | 6/2016 | Gong et al. |
| 2017/0186644 | A1 | 6/2017 | Herard et al. |
| 2017/0263565 | A1 | 9/2017 | Renard et al. |

* cited by examiner

SEMICONDUCTOR DEVICE WITH INTEGRAL EMI SHIELD

BACKGROUND

The present invention relates generally to semiconductor devices and semiconductor device packaging and, more particularly, to semiconductor device packages with Electro-Magnetic Interference (EMI) shielding.

Semiconductor device packages or integrated circuit chip carriers are used in many high-density electronics applications. The integrated circuits or semiconductor devices are protected from the external environment by encapsulation with an epoxy material or transfer molding a thermoplastic resin about the device. However, as circuits become smaller, denser, and operate at higher frequencies and in harsher environments, there is a growing need to shield the circuits from radiation, such as radio frequency interference (RFI) and electromagnetic interference (EMI). For example, cell phones and other mobile devices need to be protected from such radiation. Automotive circuits, such as microcontrollers that are mounted near the spark plugs also need to be shielded, and the typical plastic encapsulant does not provide EMI or RFI shielding.

Conventional shielding systems use a conductive metallic enclosure that surrounds the circuit to be shielded. The enclosure protects the internal circuit from EMI and RFI and prevents the escape of RFI or EMI signals generated by the circuit. Another solution is to place a metal cap over a semiconductor device either before or after molding the package. This solution is applicable to ball grid array (BGA) packages that have a large semiconductor die (i.e., at least one inch squared). Yet another solution is to provide a metal coating over the encapsulated device. However, all of these solutions have some drawbacks. For instance, using a conductive metal enclosure adds to the overall size of the package and requires an additional soldering step to attach the metal shield to the device, with the heat generated by the additional soldering process potentially harming the device.

Therefore, a need exists for cost-effective, component level shielding for semiconductor packages.

BRIEF DESCRIPTION OF THE DRAWINGS

Embodiments of the invention will become more fully apparent from the following detailed description, the appended claims, and the accompanying drawings. The drawings are not necessarily to scale, as some elements may be relatively smaller or larger than other elements, with such differences being to highlight the features of the invention. In the drawings, like reference numerals identify similar or identical elements.

DETAILED DESCRIPTION

Figure 1:
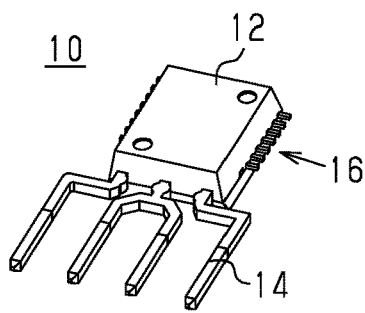
FIG. 1 is a perspective view of a convention sensor device.

Detailed illustrative embodiments of the invention are disclosed herein. However, specific structural and functional details disclosed herein are merely representative for purposes of describing example embodiments of the invention. The invention may be embodied in many alternate forms and should not be construed as limited to only the embodiments set forth herein. The terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

The present invention provides a semiconductor device including a lead frame having a die pad, a plurality of leads that surround the die pad, and a shielding lead. A first integrated circuit (IC) die is attached to a surface of the die pad and electrically connected to a first set of leads of the plurality of leads. An encapsulation material covers and forms a mold body over the lead frame and the first IC die. Outer ends of the plurality of leads project from the sides of the mold body to allow electrical signals to be transmitted to and from the first IC die. The shielding lead projects from a central location of one side of the mold body and is bent up a surface of said one side and at least partially over a top surface of the mold body. The shielding lead inhibits electromagnetic interference.

In another embodiment, the present invention is a shielded semiconductor device, including a lead frame having a die pad, a plurality of leads that surround the die pad, and a shielding lead. A first IC die is attached to a surface of the die pad and electrically connected to a first set of leads of the plurality of leads. A second IC die is attached to a top surface of the first IC die and electrically connected to at least one of the first die and a second set of the plurality of leads. A first set of bond wires electrically connect the first IC die to the first set of leads, and a second set of bond wires electrically connect the second IC die to the first IC die, the second set of leads, and the shielding lead. An encapsulation material covers and forms a mold body over the lead frame and the first IC die. Outer ends of the plurality of leads project from the sides of the mold body to allow electrical signals to be transmitted to and from the first IC die. The shielding lead projects from a central location of one side of the mold body and is bent up a surface of said one side and at least partially over a top surface of the mold body. The shielding lead inhibits electromagnetic interference.

In yet a further embodiment, the present invention provides a method of assembling a semiconductor device, including providing a lead frame having a die pad, a plurality of leads that surround the die pad, and a shielding lead, attaching a first IC die to the die pad, electrically connecting the first IC die to inner lead ends of a first set of the plurality of leads, electrically connecting the shielding lead to ground, and forming a mold body around the first IC die, the electrical connections and the lead frame with a molding compound, where distal ends of the plurality of leads project outwardly from the mold body and a distal end of the shielding lead projects outwardly from a central location of a side surface of the mold body. The distal end of the shielding lead is bent up the side surface of the mold body and over a top surface of the mold body.

Referring now to FIG. 1, a perspective view of a conventional semiconductor device 10 is shown. The semiconductor device 10 has a mold body 12 and first and second sets of pins 14 and 16 that project outward from the sides thereof. The first set of pins 14 are signal pins (e.g., bus in and bus out), while the second set of pins 16 are used for testing the internal circuitry and include pins for signals such as test clocks, test data in and out, power and ground. The conventional device 10 may be covered with a separate metal shield to prevent EMI.

Figure 2A:
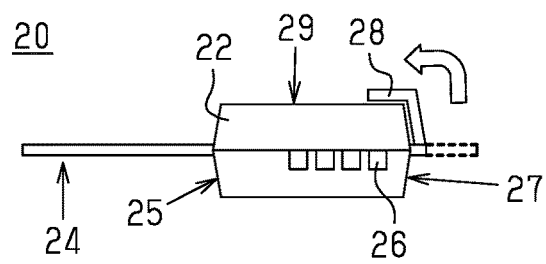
FIG. 2A is a side view of a semiconductor device in accordance with an embodiment of the present invention.

FIG. 2A is a side view of a semiconductor device 20 in accordance with an embodiment of the present invention. The device 20 comprises a mold body 22, which is formed over one or more dies and a lead frame. The lead frame, which will be described in more detail in conjunction with FIG. 3, includes a die pad and a plurality of leads or lead fingers that surround the die pad. The plurality of leads includes first and second sets of leads 24 and 26 that project outwardly from the sides of the mold body 22. In the embodiment shown, the first set of leads 24 extend from a front side 25 (left side in FIG. 2A), while the second set of leads 24 extend from one or more of the other sides of the mold body 22. In one embodiment, the first set of leads 24 comprise functional leads used for operation of the device 20, while the second set of leads 26 comprise test leads and are used for testing the device and its internal circuitry. In the embodiment shown, the functional leads 24 are much longer than the test leads 26, but this is not a requirement of the invention. It also is not a requirement of the invention that the signal leads project from only one side of the body 22, while the test leads project from the other three lateral sides.

There also is a shielding lead 28 that projects outwardly from a central location of one side of the mold body 22. In the embodiment shown, the shielding lead 28 projects from the back side 27 (right side in FIG. 2A) of the mold body 22. The shielding lead 28 is bent up a surface of the back side 27 and at least partially over a top surface 29 of the mold body 22. Prior to bending, the shielding lead 28 projects straight out of the back side 27, as shown in dashed lines. The shielding lead 28 may be attached to the back and top surfaces 27 and 29 of the mold body 22 with an adhesive, such as an epoxy or a double-sided tape. As will be discussed in more detail below, the shielding lead 28 provides EMI shielding.

Figure 2C:
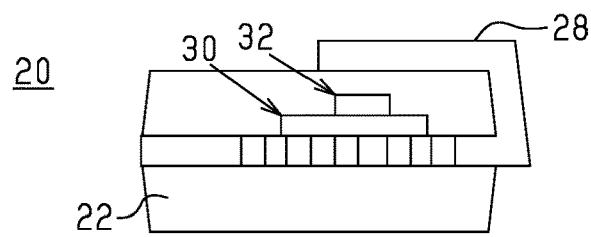
FIG. 2C is a cross-sectional side view of a portion of the semiconductor device of FIG. 2A.
Figure 2B:
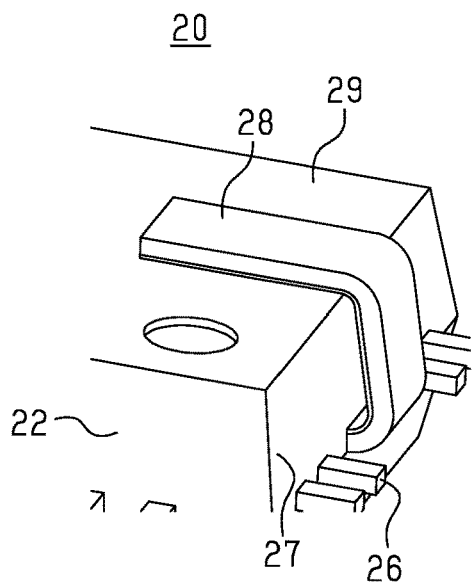
FIG. 2B is an enlarged perspective view of a portion of the semiconductor device of FIG. 2A.

FIG. 2B is an enlarged perspective view of a portion of the semiconductor device 20 of FIG. 2A. FIG. 2B shows the shielding lead 28 projecting from the back side 27 of the device 20, and extending up the back side 27 and over the top surface 29. It also can be seen that there are test pins 26 that extend from the back side 27. In the preferred embodiment, the shielding lead 28 is of greater dimensions than the test leads 26. For example, the test leads 26 may have a width of about 0.203 mm and a thickness of about 0.0127 mm, while the shielding lead 28 has a width of about 1.0 mm and a thickness of about 0.0127 mm. However, it will be understood by those of skill in the art that the shielding lead 28 may be formed in other locations of the lead frame, and that the dimensions of the shielding lead 28 will be influenced by the size of the package and the size of the die(s) that the shielding lead extends over.

FIG. 2C is a cross-sectional side view of a portion of the device 20, and illustrates that the device 20 includes a first semiconductor integrated circuit (IC) die 30. The first IC die 30 is mounted on a die pad of the lead frame and electrically connected to the functional leads 24 and the test leads 26. The first IC die 30 also may be electrically connected to the shielding lead 28. There also may be a second IC die 32 attached on a top surface of the first IC die 30 such that the dies 30 and 32 are stacked. In one embodiment, the first IC die 30 is an Application Specific IC (ASIC) and includes control circuitry and the second IC die 32 is a sensor. In another embodiment, the first IC die 30 comprises a microcontroller die and the second die 32 is a sensor. The second die 32 is connected to the first die 30, and the first die is connected to the functional pins 14. However, other arrangements of chips are possible, as will be readily understood by those of skill in the art, so the invention should not be limited by the number or arrangement of dies covered by the mold body 22.

Figure 3:
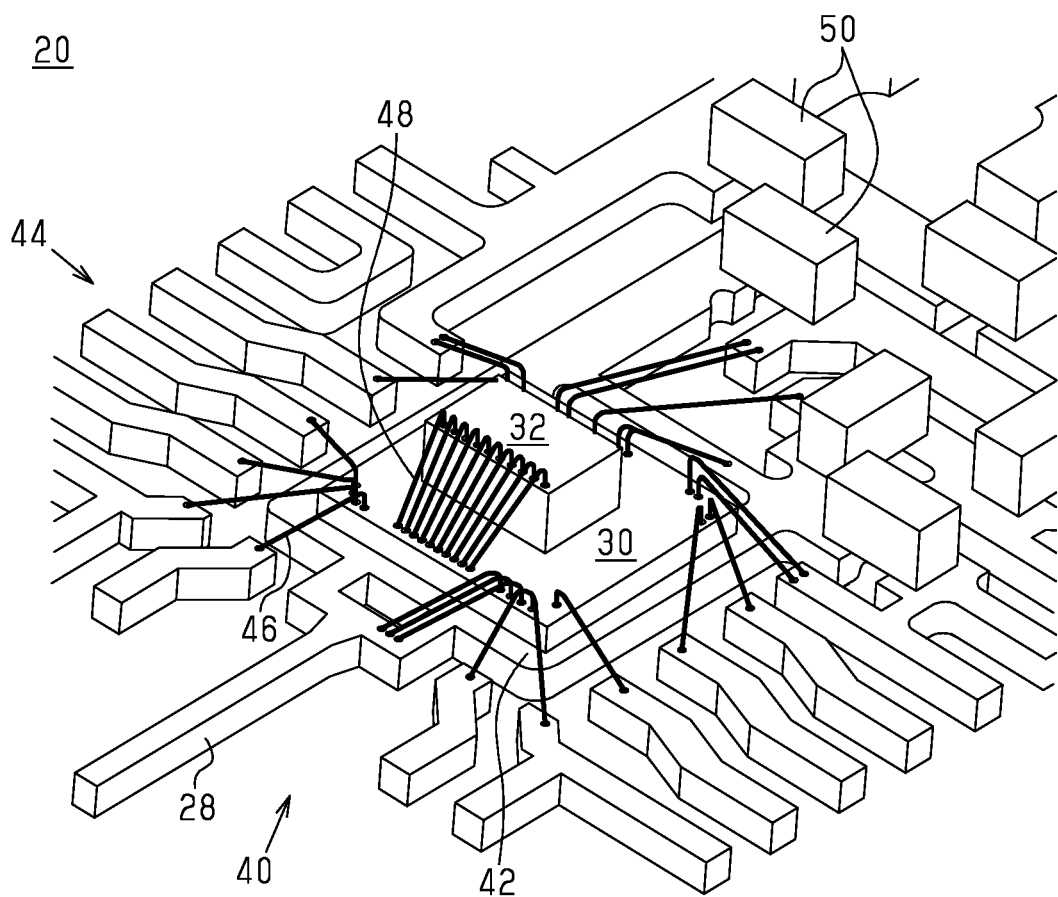
FIG. 3 is an enlarged perspective view of the semiconductor device of FIG. 2A during assembly.

FIG. 3 is an enlarged perspective view of one embodiment of the semiconductor device 20 of FIG. 2A during assembly. As can be seen, the device 20 is assembled using a lead frame 40, which includes a die pad 42 and a plurality of leads or lead fingers 44 that surround the die pad 42, and the shielding lead 28. Note, FIG. 3 is provided to show elements of the lead frame, the dies and the electrical connections therebetween.

The die pad 42 is sized and shaped to support one or more semiconductor IC dies. The leads 44 generally extend perpendicularly away from the sides of the die pad 42. The first IC die 30 is attached to the die pad 42, such as with an adhesive or adhesive tape, and electrically connected to proximal ends (the ends of the leads near to the die pad) of at least some of the leads 44 and to the shielding lead 28 with first bond wires 46. In one embodiment, the shielding lead 28 is connected to ground pads of the first IC die 30.

In the embodiment shown, the second IC die 32 is stacked on the first IC die 30. The second IC die 32 is optional and may be located adjacent to the first IC die 30. Furthermore, there could be one or more stacked dies and one or more adjacent dies. The second IC die 32 is electrically connected to the first IC die 30 with second bond wires 48. The interconnection of the first and second dies 30 and 32 by the second bond wires 48 can be a source of EMI. Accordingly, in the preferred embodiment of the invention, the shielding lead 28 extends over the second bond wires 48. Thus, the length of the shielding lead 28 will depend on how far the lead 28 must extend over the top surface of the mold body 22 in order to lie overtop of the second bond wires 48 (or any other specific source of EMI).

The lead frame 40 may comprise copper that is at least partially plated with a non-corrosive metal or metal alloy, as is known in the art, and the die pad 42 may be rectangular. The lead frame 32 preferably is formed from a copper sheet by punching, stamping, cutting or etching, as is known in the art, and the underlying metal (e.g., Cu) is plated with one or more other metals or an alloy, such as Ni, Pd, and Au. The lead frame 32 includes the leads 14, the die receiving area 16, and the bendable strip 28 (shielding lead). The device 20 also may include a plurality of passive devices 50 that span some adjacent ones of the leads, but this is not a requirement of the invention.

An encapsulation material (not shown in FIG. 3) is formed over the first and second IC die 30 and 32, the electrical connections 46 and 48, and the lead frame 40 to form the mold body 22. Distal ends of the leads 44 then project outwardly from the sides of the mold body 22. More particularly, as discussed with reference to FIG. 2A, signal leads 24 project from one side (the left side of the body in FIG. 2) of the body 22 and the test leads 24 project from one or more of the other lateral sides of the body 22. The shielding lead 28 also has a distal portion that projects from a central location of one side of the mold body 22 and is bent up a surface of the one side and at least partially over the top surface 29 of the mold body 22.

Figure 4:
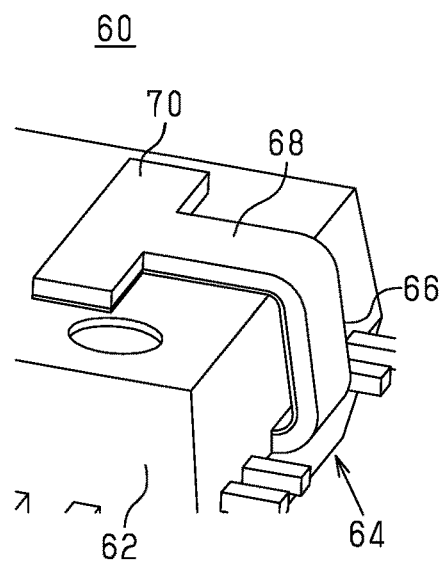
FIG. 4 is an enlarged perspective view of a portion of a semiconductor device according to another embodiment of the present invention.

FIG. 4 is an enlarged perspective view of a portion of a semiconductor device 60 in accordance with another embodiment of the present invention. The device 60 is similar to the device 20 of FIG. 2A, having a mold body 62 and a shielding lead 64 that projects outwardly therefrom. Like the device 20, the shielding lead 64 is bent vertically such that it extends up a backside of the body 62 and then bent again so that it extends over a top surface of the body 62. Thus, the shielding lead 64 has a first exterior section 66 that extends vertically along the back side of the device 60 and a second exterior portion 68 that extends horizontally over the top surface of the device 60. Further, what is different from the embodiment shown in FIG. 2A is that the second exterior portion 68 of the shielding lead 64 has a rectangular distal end portion 70 such that the shielding lead 64 is T-shaped. In one embodiment, the distal end portion 70 is sized and shaped like an underlying IC chip such that the distal end 70 extends over substantially all of the surface of the IC die beneath the mold compound and at least some of the electrical connections between the IC die and the leads to which the die is connected. Thus, the distal end portion 70 has a width that is greater than a width of the second exterior portion 68.

While the invention has been described with the first IC die electrically connected to the lead frame with bond wires, it will be understood by those of skill in the art that the bottom die could be flip-chip connected to the lead frame. Also as will be understood by those of skill in the art, trim and form processes are performed in which outer portions of the lead frame are cut away and the outer lead ends of the leads 24, 28 and 28 extend beyond an outer edge of the body 22, thereby providing the packaged semiconductor device 20. The outer lead ends of some of the leads, such as the test leads, may or may not extend beyond the outer edge of the body 12 depending on design requirements and the functional leads may be bent into desired shapes such as Gull Wing and J-leads.

As will now be apparent, the present invention provides a packaged semiconductor device that has a shielding lead that extends vertically and horizontally around the body of the device to provide EMI and RFI shielding. The shielding lead is part of a lead frame. The shielding lead may include one or more kinks to facilitate bending the lead around the outside of the package. The shielding lead may be bent around the mold body during a normal trim and form operation, thus extra steps for attaching a separate shield or metal cap are not necessary, which saves on assembly time and cost.

Unless explicitly stated otherwise, each numerical value and range should be interpreted as being approximate as if the word "about" or "approximately" preceded the value or range. Also, although labels such as top, bottom, front and back have been used, it is understood that such are relative terms, so such surfaces or orientations are not absolute. Furthermore, although stacked die devices are shown and described, the invention is not limited to stacked die devices, as a single die device, a device with side-by-side dies, or a device with a combination of stacked dies and side-by-side dies may be assembled that include the shielding lead.

It will be further understood that various changes in the details, materials, and arrangements of the parts that have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. A semiconductor device, comprising:
   a lead frame having a die pad, a plurality of leads that surround the die pad, and a shielding lead;
   a first integrated circuit (IC) die attached to a surface of the die pad and electrically connected to a first set of leads of the plurality of leads and to the shielding lead; and
   an encapsulation material that covers and forms a mold body over the lead frame and the first IC die,
   wherein outer ends of the plurality of leads project from the sides of the mold body to allow electrical signals to be transmitted to and from the first IC die, and
   wherein the shielding lead projects from a central location of one side of the mold body and is bent up a surface of said one side and at least partially over a top surface of the mold body such that the shielding lead extends at least partially over the first IC die, whereby the shielding lead inhibits electromagnetic interference.

2. The semiconductor device of claim 1, further comprising a second IC die attached to a top surface of the first IC die and electrically connected to at least one of the first die and a second set of the plurality of leads.

3. The semiconductor device of claim 2, wherein the first IC die comprises a microcontroller and the second IC die comprises a sensor.

4. The semiconductor device of claim 2, further comprising a first set of bond wires that electrically connect the first IC die to the first set of leads and to the shielding lead.

5. The semiconductor device of claim 4, further comprising a second set of bond wires that electrically connect the second IC die to the first IC die.

6. The semiconductor device of claim 5, wherein the shielding lead extends over a top surface of the second IC die.

7. The semiconductor device of claim 1, wherein the lead frame comprises copper that is at least partially plated with a non-corrosive metal or metal alloy.

8. The semiconductor device of claim 1, wherein the die pad is rectangular.

9. The semiconductor device of claim 1, wherein the shielding lead is attached to the top surface of the mold body with an adhesive.

10. The semiconductor device of claim 1, wherein an outer end of the shielding lead that is on top of the top surface of the mold body has a width that is greater than a width of the rest of the shielding lead.

11. The semiconductor device of claim 1, wherein the shielding lead has a width and a length that are greater than a width and a length of the second plurality of leads.

12. A semiconductor device, comprising:
 a lead frame having a die pad, a plurality of leads that surround the die pad, and a shielding lead;
 a first integrated circuit (IC) die attached to a surface of the die pad and electrically connected to a first set of leads of the plurality of leads;
 a second IC die attached to a top surface of the first IC die and electrically connected to at least one of the first die and a second set of the plurality of leads;
 a first set of bond wires that electrically connect the first IC die to the first set of leads;
 a second set of bond wires that electrically connect the second IC die to the first IC die, the second set of leads, and the shielding lead; and
 an encapsulation material that covers and forms a mold body over the lead frame and the first IC die,
 wherein outer ends of the plurality of leads project from the sides of the mold body to allow electrical signals to be transmitted to and from the first IC die, and
 wherein the shielding lead projects from a central location of one side of the mold body and is bent up a surface of said one side and at least partially over a top surface of the mold body such that the shielding lead extends at least partially over the first and second IC dies, whereby the shielding lead inhibits electromagnetic interference.

13. The semiconductor device of claim 12, wherein the first IC die comprises a microcontroller and the second IC die comprises a sensor.

14. The semiconductor device of claim 13, wherein the shielding lead extends over a top surface of the sensor.

15. A method of assembling a semiconductor device, comprising:
 providing a lead frame including a die pad, a plurality of leads surrounding the die pad, and a shielding lead;
 attaching a first integrated circuit (IC) die to the die pad of the lead frame;
 electrically connecting the first IC die to inner lead ends of a first set of the plurality of leads;
 forming a mold body around the first IC die, the electrical connections and the lead frame with a molding compound, wherein distal ends of the plurality of leads project outwardly from the mold body and a distal end of the shielding lead projects outwardly from a central location of a side surface of the mold body; and
 bending the distal end of the shielding lead up the side surface of the mold body and over a top surface of the mold body such that the shielding lead extends at least partially over the first IC die.

16. The method of claim 15, further comprising attaching a second IC die to a top surface of the first IC die and electrically connecting the second IC die to the first IC die and to the shielding lead.

17. The method of claim 16, wherein the first IC die comprises a microcontroller and the second IC die comprises a sensor.

18. The semiconductor device of claim 17, wherein the shielding lead extends over a top surface of the sensor.

19. The method of claim 15, further comprising attaching the distal end of the shielding lead to the top surface of the mold body with an adhesive.

* * * * *